United States Patent [19]

Srour et al.

[11] Patent Number: 4,866,669
[45] Date of Patent: Sep. 12, 1989

[54] ELECTRONIC MEMORY DEVICE UTILIZING SILICON-ON-SAPPHIRE TRANSISTORS

[75] Inventors: Joseph R. Srour, Redondo Beach; Siegfried Othmer, Sherman Oaks, both of Calif.

[73] Assignee: The United States of America as represented by the Secretary of the Army, Washington, D.C.

[21] Appl. No.: 198,802

[22] Filed: May 5, 1988

[51] Int. Cl.⁴ ............................................. G11C 11/34
[52] U.S. Cl. ..................................... 365/176; 365/118
[58] Field of Search ............... 357/23.7; 364/176, 118, 364/128, 114

[56] References Cited

U.S. PATENT DOCUMENTS 3,656,121  4/1972  Rajchman et al. .................. 365/176

Primary Examiner—Joseph A. Popek
Attorney, Agent, or Firm—Saul Elbaum; Guy M. Miller; Muzio B. Roberto

[57] ABSTRACT

An electronic memory device is disclosed which utilizes silicon-on-sapphire (SOS) transistors that exhibit binary states dependent upon the dose of ionizing radiation to which they are subjected. A memory utilizing such SOS transistors may have information written into it, permanently or for a short period of time, by electron-beam bombardment so that the memory operates as a PROM. The memory may also operate as a RAM when a scanning electron beam, in conjunction with appropriately applied biases, is used to read and write information at a high rate.

10 Claims, 2 Drawing Sheets

ELECTRONIC MEMORY DEVICE UTILIZING SILICON-ON-SAPPHIRE TRANSISTORS

RIGHTS OF THE GOVERNMENT

The invention described herein may be manufactured, used, and licensed by or for the United States Government for governmental purposes without the payment to us of any royalty thereon.

FIELD OF THE INVENTION

The present invention relates to solid state memories for data processing equipment and more particularly to a memory utilizing silicon-on-sapphire transistors.

BACKGROUND OF THE INVENTION

Semiconductor memories have undergone intensive research and development in recent years to develop increasingly efficient, faster and less expensive memories for use with microprocessors. The present invention achieves these objectives, when compared with a multitude of prior art memory devices, by using silicon-on-sapphire (SOS) technology.

Basically, logic states in SOS transistors may be altered by ionizing radiation. In the past, it has been observed that bombardment of a silicon-on-sapphire (SOS) N-channel MOS transistor with ionizing radiation gives rise to a "back-channel" leakage current $I_l$. This current flows between drain and source terminals in the silicon adjacent to the silicon-sapphire interface. Formation of the back channel has been previously attributed to radiation-induced positive charge buildup in the sapphire ($Al_2O_3$) substrate near this interface. The increase in $I_l$ with ionizing dose can be as large as three to four orders of magnitude after a dose of $10^3$ to $10^5$ rads (Si). This increase will be observed if the device is irradiated with a typical value of drain-to-source voltage ($V_{ds}$) applied, such as 10 V. The magnitude of the applied gate bias ($V_{gs}$) during irradiation appears to be relatively unimportant in terms of affecting leakage current production.

BRIEF DESCRIPTION OF THE PRESENT INVENTION

The present invention utilizes a conventional silicon-on-sapphire n-channel MOS transistor in an integrated circuit for memory applications. This type of device displays characteristics whereby at very low doses and at high doses back-channel leakage current flows between drain and source of the device. Thus, one can consider two leakage current states for an SOS transistor, irradiated with a drain-to-source bias voltage, as corresponding to relatively low current and relatively high current. If one then further considers two biasing conditions under which the transistor would be irradiated, such as with the drain-source voltage equal to zero and equal to some appropriate positive voltage, four basic conditions may be defined, as explained in detail hereinafter.

A memory may be envisioned in which information is written in, permanently or for a short duration, by electron-beam bombardment. Such a memory would fall into the programmable read-only memory (PROM) category. One can also envision a random-access memory (RAM) in which a scanning electron beam, in conjunction with appropriately applied biases, is used to read and write information at a high rate.

The above-mentioned objects and advantages of the present invention will be more clearly understood when considered in conjunction with the accompanying drawings, in which:

DETAILED DESCRIPTION OF THE INVENTION

Figure 1:
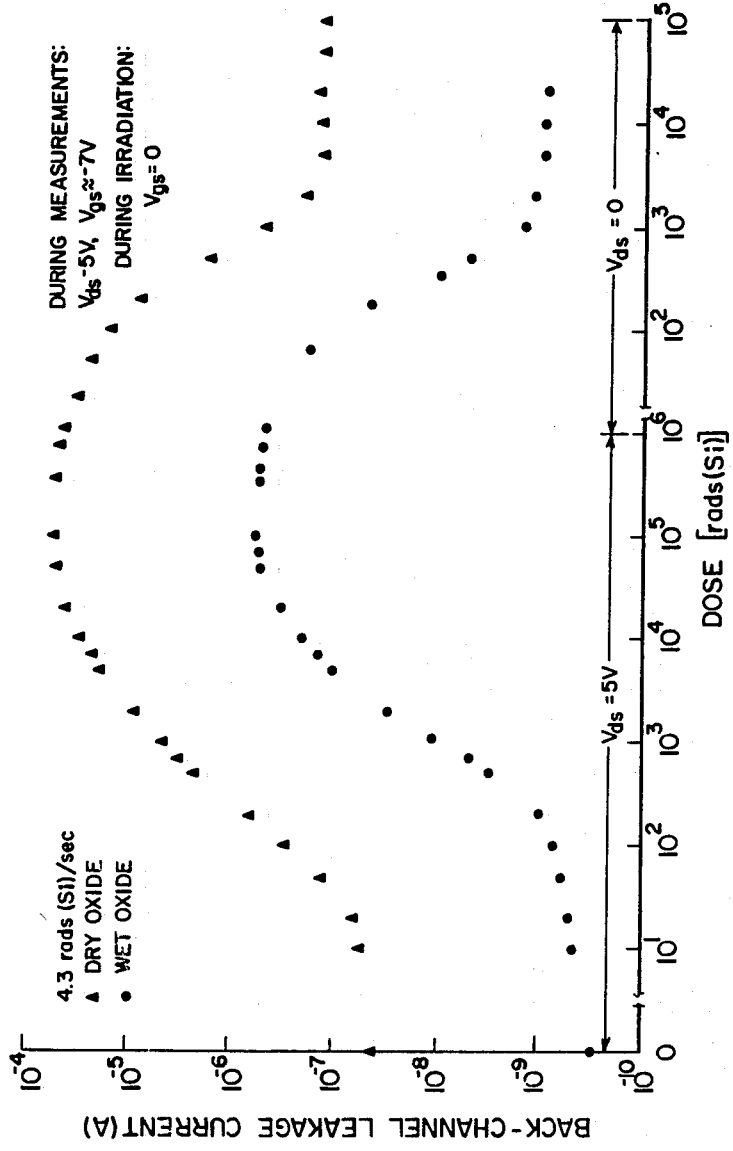
FIG. 1 is a plot of leakage current versus dose for dry and wet oxide n-channel SOS transistors.
Figure 2:
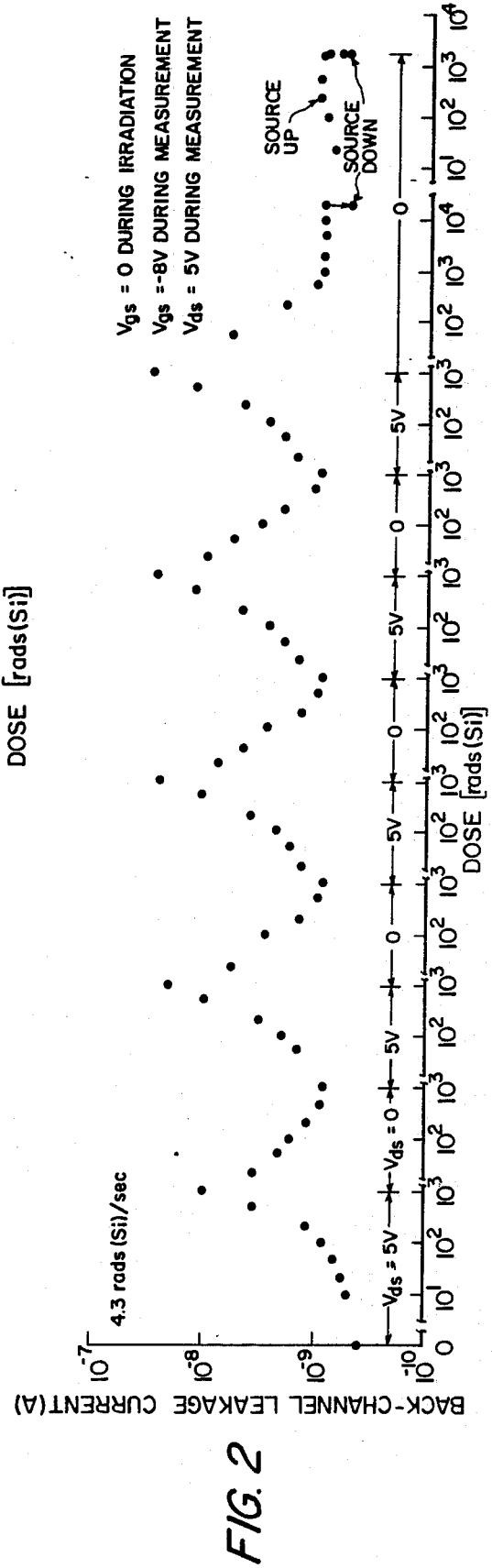
FIG. 2 is a plot of leakage current versus dose for a wet oxide n-channel SOS transistor with a cycling drain-source bias applied.

The basic phenomenon which permits operation of the present invention is a significant reduction of radiation-induced leakage current by irradiating a previously irradiated device with a drain-source voltage equal to zero. For certain devices studied, the leakage current $I_l$ was reduced from its post-irradiation value to within 25 percent of its preirradiation value by this zero bias "radiation-induced annealing"(RIA) process. Illustration of this annealing effect is shown in FIGS. 1 and 2. An SOS transistor, as utilized in the present invention, is a prior art device which may be purchased from several leading semiconductor manufacturers. In FIG. 1, the radiation response of two n-channel SOS transistors is compared, with $I_l$ versus dose ($Co^{60}$) being shown for a wet gate oxide device and a dry gate oxide device, respectively. Irradiations were performed with the gate-source voltage ($V_{gs}$) equal to zero and a drain-source voltage ($V_{ds}$) equal to five volts, but leakage-current measurements were performed with $V_{gs}$ approximately equal to $-7$ volts to avoid measurement of front-channel current. This was accomplished by switching $V_{gs}$ from zero to $-7$ volts for a time long enough (approximately two seconds) to measure $I_l$ and then switching back to zero volts. The general shape of the wet oxide data is similar to that for dry oxide, with saturation in leakage current being observed for doses $\geq 10^5$ rads in both cases. An analysis of the data suggests that hole trapping centers in the sapphire responsible for the increase in $I_l$ are identical in nature for the wet and dry oxide devices studied and that the trap density in the dry case is a factor of 90 larger than in wet transistors for the data of FIG. 1.

Recovery of $I_l$ is evident in the right-hand portion of FIG. 1 and was accomplished by continuing $Co^{60}$ irradiation with $V_{ds}=0$. This process can be repeated as evidenced by data in FIG. 2. This latter figure shows findings for a wet oxide transistor irradiated with $V_{ds}=5$ V to a dose of $10^3$ rads, at which point $V_{ds}$ was reduced to zero and irradiation continued. Substantial recovery is evident. This process was repeated for four more cycles as shown. Upon completion of this cycling experiment, the $Co^{60}$ source was lowered (dose rate=0—"source down" condition in FIG. 2), with a resulting decrease in $I_l$ to within 25 percent of the preirradiation value. During experimentation, the source was raised again (with $V_{ds}=0$) and $I_l$ increased. This increase was attributed to a photocurrent. Radiation-induced increases and RIA have been examined using low-energy electron bombardment (6 to 15 keV) and results similar to those obtained using $Co^{60}$ have been noted.

At present, the experimental findings are interpreted as follows. With $V_{ds}$ applied, a fringing field will be present in the sapphire in the region between source and drain. Assuming that electrons are quite mobile in sapphire and that holes are relatively immobile (readily trapped), positive charge buildup in the sapphire results due to the trapping of holes near the interface and a sweeping out of electrons from this region by the fringing field. If $V_{ds}$ is reduced to zero, this field disappears and further pair generation by radiation will not result in additional positive charge buildup. We have observed that bombardment with relatively low energy electrons is effective in causing recovery, which suggests that the recovery mechanism is injection of excited electrons from Si into sapphire where they recombine with trapped holes. With $V_{ds}$ applied, injected electrons would be swept out without recombination occurring.

The above-discussed radiation-induced annealing permits the use of an SOS integrated circuit for memory applications which is the thrust of the present invention. In further explanation of the annealing phenomenon as utilized by the present invention, consider the data plotted in FIG. 1. At very low and high doses, plateaus are evident. Hence, one can thick of two $I_l$ states for an SOS transistor irradiated with $V_{ds}$ applied. These would be relatively low leakage current ($I_{low}$) and relatively high current ($I_{high}$). Two biasing conditions may be considered under which the transistor would be irradiated. These are $V_{ds}=0$ and $V_{ds}=+V$. Thus, four basic conditions may be defined as indicated in the table below. The irradiation referred to in this table is of short duration and relatively high dose and, for example, could be accomplished by electron beam bombardment.

FOUR RESULTING CONDITIONS FOR AN SOS STRUCTURE IRRADIATED IN EITHER THE $I_{low}$ OR $I_{high}$ STATE WITH EITHER $V_{ds}=0$ OR $V_{ds}=+V$ APPLIED.

| Pre-Irradiation Current State | V During Irradiation | Post Irradiation Current State |
|---|---|---|
| $I_{low}$ | 0 | $I_{low}$ |
| $I_{low}$ | +V | $I_{high}$ |
| $I_{high}$ | +V | $I_{high}$ |
| $I_{high}$ | 0 | $I_{low}$ |

Figure 3:
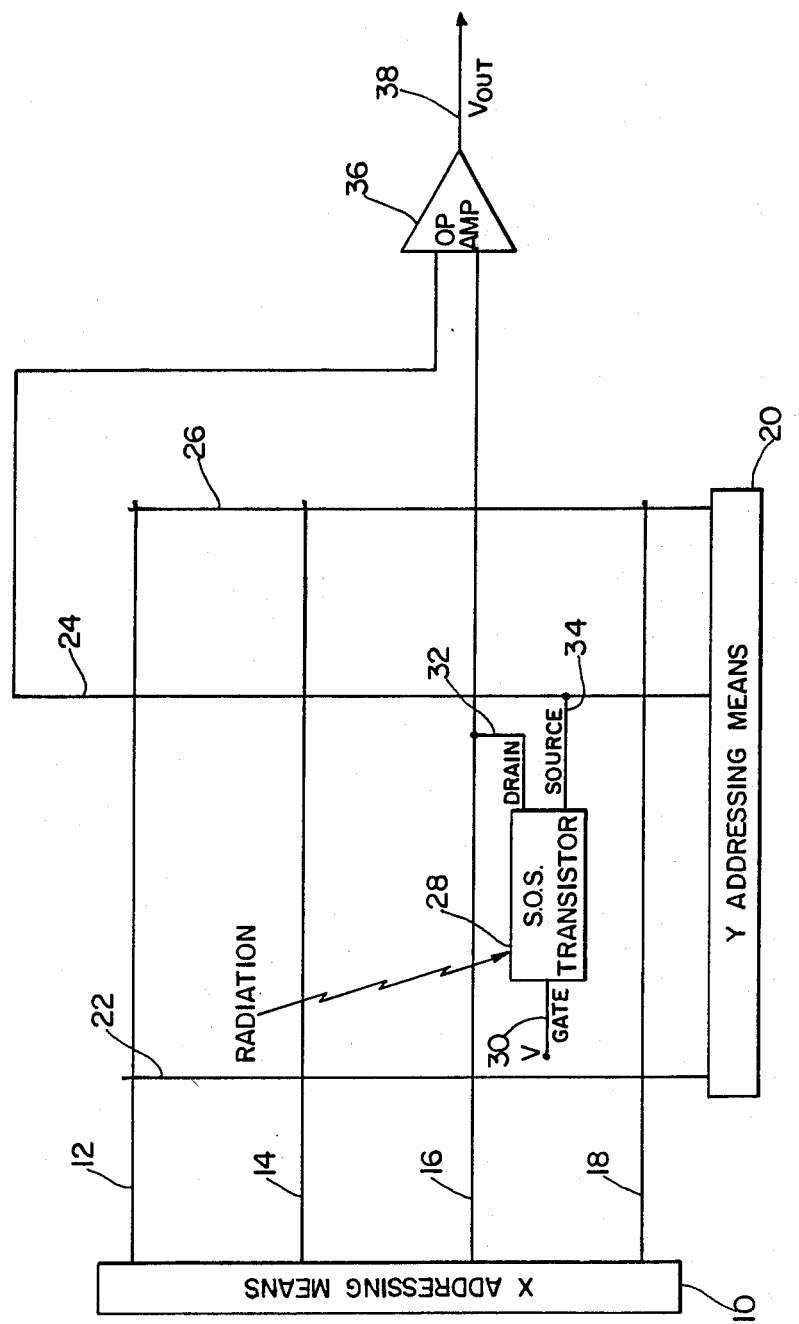
FIG. 3 is a schematic diagram illustrating the connection of an SOS transistor within an addressing matrix.

FIG. 3 illustrates a basic memory configuration of a single SOS transistor in an X-Y addressing matrix. It is to be understood that in a multi-memory cell configuration a plurality of such transistors are employed at corresponding X-Y coordinates within the matrix as is conventional with other types of solid state devices, such as diodes. A conventional X addressing means 10 enables a plurality of X addressing lines, such as 12, 14, 16 and 18. In a similar manner, conventional Y addressing means 20 enables a plurality of Y addressing lines, such as 22, 24 and 26. The single illustrated SOS transistor 28 has its gate terminal 30 biased at a preselected potential. For n-channel SOS transistors, a fixed negative value of applied gate bias (typically several volts) is appropriate for proper memory operation. This bias will not affect leakage current production or reduction during irradiation and will suppress the front-channel current and current at island edges during readout of the back-channel current. The drain terminal 32 is connected to a selected X address line, such as 16, while the source terminal 34 is connected to a respective Y address line 24. The SOS transistor is seen to undergo irradiation by a conventional source such as an electron-beam-bombardment source.

In a first mode of operation, such a memory configuration may operate with information which is written in, permanently or for a short duration, by means such as electron-beam-bombardment. The memory would then operate as a PROM. Depending upon the pre-irradiation leakage current state and the $V_{ds}$ during irradiation, one of two post-irradiation leakage current states will result.

A RAM memory configuration may be implemented by the use of a scanning electron beam, in conjunction with appropriately applied biases $V_{ds}$. In such an event, data may be read in and written from the memory at a high rate.

To detect whether a given transistor is in a low or high leakage current state, it is merely necessary to apply a prescribed $V_{ds}$ bias between the drain and source terminals 32, 34 by appropriate X-Y addressing from means 10, 20. An operational amplifier 36 is connected to respective transistor X-Y addressing lines 16 and 24 so that a current-to-voltage conversion may result at the output lead 38 permitting processor distinction between the two states.

Accordingly, a new use for an SOS transistor has been invented in a novel solid state memory which is alterable by radiation. The resulting memory configuration may be fabricated relatively inexpensively and produce high memory operation speed.

We wish it to be understood that we do not desire to be limited to the exact details of construction shown and described, for obvious modifications can be made by a person skilled in the art.

We claim:

1. A digital memory cell comprising:
   a silicon-on-sapphire transistor having gate, drain and source terminals;
   means for biasing the gate terminal at a preselected potential;
   X and Y addressing means;
   matrix means connected to the addressing means;
   means connecting the drain and source terminals to preselected matrix coordinate points; and
   means connected to the matrix for detecting which of two leakage current states exist in the transistor after irradiation thereof, the current states corresponding to binary states.

2. The structures set forth in claim 1 wherein the detecting means comprises an operating amplifier for converting the current levels into corresponding voltage levels.

3. The structure set forth in claim 2 wherein the irradiation is characterized by electron-beam bombardment.

4. A digital memory array of silicon-on-sapphire transistors each having gate, drain and source terminals;
   means for biasing the gate terminals at a preselected potential;
   X and Y addressing means;
   matrix means connected to the addressing means;
   means connecting the drain and source terminals of each transistor to respective matrix coordinate points; and
   a plurality of means connected to the matrix for detecting which of two leakage current states exist in each transistor after irradiation thereof, the current states corresponding to binary states.

5. The structure set forth in claim 4 wherein each detecting means comprises an operating amplifier for converting the current levels into corresponding voltage levels.

6. The subject matter set forth in claim 5 wherein the irradiation is characterized by electron-beam bombardment.

7. A method establishing binary states in a silicon-on-sapphire transistor memory array, the method comprising the steps:
   applying a preselected bias potential to the gate terminals of the transistors in the array;
   subjecting the drain and source terminals of each transistor to one of two preselected bias voltages;
   irradiating the transistors; and
   detecting the leakage current in the transistors at a first or second level, corresponding to the first and second binary states.

8. The method of claim 7 wherein the irradiation is due to electron-beam bombardment.

9. The method of claim 7 wherein the irradiation is due to scanning-electron-beam bombardment.

10. The method of claim 7 wherein said first level of said leakage current is $I_{low}$ and said second level of said leakage current is $I_{high}$, said drain-source bias voltage being 0 during said irradiation to achieve $I_{low}$ and said drain-source bias voltage being $+V$ during said irradiation to achieve $I_{high}$.

* * * * *